Figure 1:
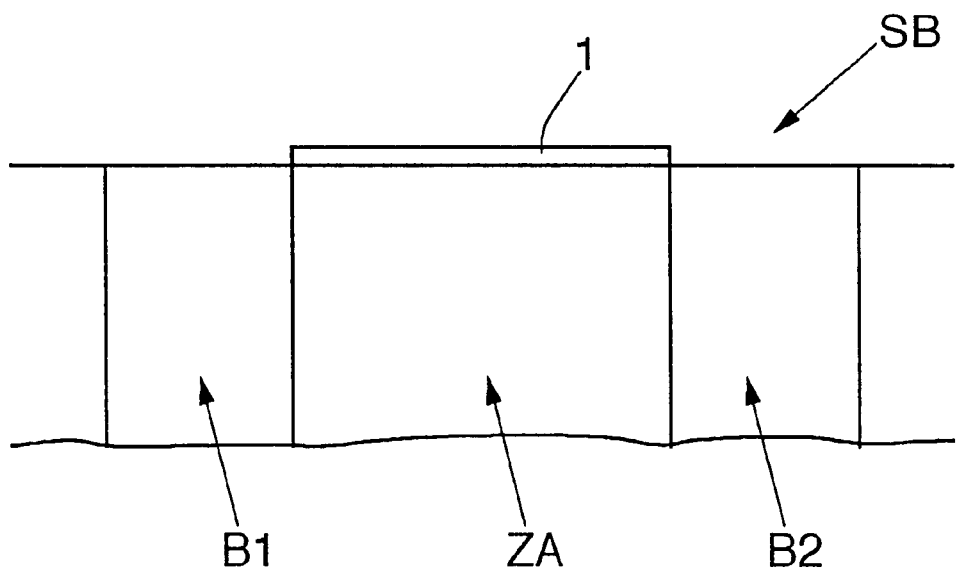

United States Patent

Sagnes

[11] Patent Number: 5,998,289
[45] Date of Patent: Dec. 7, 1999

[54] PROCESS FOR OBTAINING A TRANSISTOR HAVING A SILICON-GERMANIUM GATE

[75] Inventor: Isabella Sagnes, Paris, France

[73] Assignee: France Telecom, Paris, France

[21] Appl. No.: 09/102,849

[22] Filed: Jun. 23, 1998

[30] Foreign Application Priority Data

Jun. 25, 1997 [FR] France ................................. 97 07938

[51] Int. Cl.[6] ................................................ H01L 29/772
[52] U.S. Cl. ........................... 438/592; 257/407; 438/233
[58] Field of Search ..................... 438/172, 186, 438/197, 199, 588, 590, 591, 592; 257/262, 288, 616, 19, 63, 65

[56] References Cited

U.S. PATENT DOCUMENTS

| | | | |
|---|---|---|---|
| 5,019,882 | 5/1991 | Solomon et al. | 257/409 |
| 5,155,571 | 10/1992 | Wang et al. | 257/19 |
| 5,241,214 | 8/1993 | Herbots et al. | 257/649 |
| 5,354,700 | 10/1994 | Huang et al. | 438/151 |
| 5,461,243 | 10/1995 | Ek et al. | 257/190 |
| 5,461,250 | 10/1995 | Burghartz et al. | 257/347 |
| 5,665,981 | 9/1997 | Banerjee et al. | 257/66 |

OTHER PUBLICATIONS

XP000198032 Özürk, et al., "Rapid Thermal Chemical Vapor Deposition Of Germanium and Germanium/Silicon Alloys on Silicon: New Applications in the Fabrication of MOS Transistors," Materials Research Society Symposium Proceedings, vol. 224, published 1991, pp. 223–234.

XP000481715 Kistler, et al., "Symmetric CMOS In Fully- –Depleted Silicon–On–Insulator Using P+ –Polycrystalline Si–Ge Gate Electrodes,"IEDM, published Dec. 5, 1993, pp. 30.2.1 through 30.2.3.

Search Report for FR 9707938 dated Mar. 12, 1998.

*Primary Examiner*—Olik Chaudhuri
*Assistant Examiner*—Anh Duy Mai
*Attorney, Agent, or Firm*—Conley, Rose & Tayon, PC

[57] ABSTRACT

The process includes the deposition of a stack of $Si/Si_{1-x}Ge_x/Si$ layers (2, 3, 4) on a gate oxide layer (1) in a single-wafer reactor and then the etching of the gate (GR) using an inorganic mask (5). Next, the gate (GR) is encapsulated in a material (7) which is non-oxidizing with respect to germanium before the isolating spacers (8) are formed.

20 Claims, 3 Drawing Sheets

PROCESS FOR OBTAINING A TRANSISTOR HAVING A SILICON-GERMANIUM GATE

The invention relates to silicon-germanium isolated-gate field-effect transistors, i.e. those having a layer of silicon-germanium or, optionally, of pure germanium ($Si_{1-x}Ge_x$ where $0 < x \leq 1$) and in particular a layer having a germanium concentration of between 50 and 100% ($0.5 \leq x \leq 1$).

In current CMOS technologies, i.e. those having gate widths greater than or equal to 0.25 $\mu$m, the gate of field-effect transistors is made of polycrystalline or amorphous silicon.

It has been shown that a gate structure which includes an $Si_{1-x}Ge_x$ layer is an advantageous alternative in CMOS technology.

This is because the $Si_{1-x}Ge_x$ material, in addition to having, for equal doping, a lower resistance than polycrystalline silicon, offers the possibility of shifting the threshold voltage of the PMOS device obtained, depending on the germanium content of the polycrystalline $Si_{1-x}Ge_x$ layer. Thus, it may be used as a mid-gap material in a $p^+$ gate structure instead of the conventional $p^+/n^+$ structure, i.e., in the case of example, in the case of transistors having n and p channels with a single gate which includes a polycrystalline $Si_{1-x}Ge_x$ layer of $p^+$ conductivity.

In addition, a gate having a very high germanium concentration ($\geq 75\%$) or one made of pure germanium has, in addition, the advantage of being compatible with both of the two types (n and p) of transistors, which therefore leads to a saving in technological steps (elimination of at least two photolithography steps and, if the layer is in-situ doped, two implantation steps).

$Si_{1-x}Ge_x$ layers have already been deposited on a silicon oxide layer by low-pressure chemical vapour deposition (LPCVD) in multi-wafer furnaces. This process requires the predeposition of a pure silicon primer layer on which the polycrystalline $Si_{1-x}Ge_x$ layer is deposited. This primer layer makes it possible to obtain an acceptable grain size in the $Si_{1-x}Ge_x$ layer, as it prevents the tendency of the germanium to ball up, as in the case of depositing $Si_{1-x}Ge_x$ directly on a silicon oxide layer, which, depending on the duration and temperature of the deposition, results in accelerated grain growth to the detriment of nucleation.

The uses of LPCVD deposition processes, as indicated previously, are described in the articles "Symmetric CMOS in fully-depleted silicon-on-insulator using $p^+$ polycrystalline Si—Ge gate electrodes" by Neal KISTLER and Jason WOO, IEDM 93, p. 727–730 and "A polycrystalline-$Si_{1-x}Ge_x$-gate CMOS Technology" by T. KING et. al., IEDM 90, p. 253–256.

These processes of the prior art have several drawbacks.

The use of "batch" multi-wafer techniques proves not to be very practical as the thermal masses of the batches of wafers, for example 200 mm wafers, the purge and temperature-stabilization times and the low working pressure which the reactors require must be taken into account.

Moreover, the thermal inertia of these multi-wafer reactors, which makes it difficult to create the large temperature variations necessary, does not allow optimum deposition of the primer layer, the $Si_{1-x}Ge_x$ layer and possibly a protective silicon layer.

Moreover, a process enabling all the steps leading to complete fabrication of the transistor to be linked together is not known at the present time because, in particular, of the difficulties of etching the gate of the transistor.

The invention therefore provides a process for obtaining an $Si_{1-x}Ge_x$ isolated-gate field-effect transistor, where $0 < x \leq 1$, from a semiconductor substrate which includes a so-called active region surmounted by a gate oxide layer, this process comprising:

a first phase of treatment inside a single-wafer reactor, which includes depositing, on the gate oxide layer, a silicon primer layer with a thickness of less than or equal to 2 nm using chemical vapour deposition (CVD) at a temperature of less than or equal to 580° C. and depositing, on the primer layer, a stack which includes a first continuous layer formed from $Si_{1-x}Ge_x$, obtained by chemical vapour deposition (CVD) at a temperature of less than or equal to 550° C., surmounted by a second silicon layer, then a phase of forming the gate of the transistor, which includes depositing, on said stack, a top layer consisting of an inorganic material, etching firstly the said top layer so as to obtain an inorganic mask surmounting the said stack, etching secondly the said stack using the said mask, so as to form the gate region, and depositing, on the gate region, an encapsulation layer formed from a material which is non-oxidizing with respect to germanium, and then a second treatment phase which includes forming, on the side walls of the encapsulated gate, isolating side regions formed from a material which is non-oxidizing with respect to germanium.

The single-wafer reactors for implementing the process according to the invention are known in the art and comprise a central device for loading wafers which introduces the wafers, for example 200 mm-diameter wafers, one by one in a pre-established sequence, into treatment chambers distributed around this central loading device. Such a reactor type is the Centura HT® model sold by the company Applied Materials or the Epsilon one® model sold by the company A.S.M.

The use of such a single-wafer reactor makes it possible to work at pressures from about 100 Pa to atmospheric pressure and allows the temperature of the treated wafer to be rapidly varied in order to carry out the various steps of the deposition at the optimum temperature for each layer of the stack, all this in the time compatible with industrial production requirements.

The rapid and controlled temperature variations allow the growth of layers which are uniform in thickness and in composition in a short time, thereby limiting the effects of grain growth and therefore the roughness.

The primer layer is advantageously deposited at a temperature of between 500 and 580° C., while the first continuous layer formed from $Si_{1-x}Ge_x$ is deposited at a temperature of between 400 and 500° C.

Advantageously, the primer layer has a thickness of less than or equal to 2 nm and preferably about 0.5 nm. Consequently, the deposition time must be determined depending on the other deposition conditions in order to ensure that the thickness of the primer layer has the desired layer.

The formation of such a primer layer with a thickness of less than or equal to 1 nm makes it possible to deposit a $Si_{1-x}Ge_x$ layer having a minimum grain size of about 20 nm in the most unfavourable case for a 100 nm deposition, without affecting the electrical properties (shift in the threshold voltage $V_t$).

Advantageously, a mixture of silane and hydrogen ($SiH_4/H_2$) is used for depositing the primer layer. The gas flow rates used are generally 400 $cm^3$/min under standard conditions in the case of silane and preferably from 20 to 30 liters per minute under standard conditions in the case of hydrogen. The total deposition pressure is atmospheric pressure.

The gas mixture generally used for depositing the $Si_{1-x}Ge_x$ first continuous layer is formed from a mixture of silane, germane and hydrogen ($SiH_4/GeH_4/H_2$).

The proportions of the various gases in the mixture vary depending on the desired germanium and silicon contents of the $Si_{1-x}Ge_x$ layer and may be easily determined by those skilled in the art depending on the desired composition of the $Si_{1-x}Ge_x$ layer.

The deposition is carried out at a temperature of between 400 and 550° C., and preferably at 450° C., whatever the value of x lying between 0.5 and 1 inclusive.

The deposition pressure is atmospheric pressure.

The deposition time depends on the temperature and pressure conditions, on the proportions of the various gases in the gas mixture and on the desired thickness of the polycrystalline $Si_{1-x}Ge_x$ layer. In general, the thickness of the polycrystalline $Si_{1-x}Ge_x$ layer will be between 50 nm and 200 nm, preferably between 100 and 150 nm and better still between 80 and 150 nm. The thickness of the second layer of polycrystalline or amorphous Si is about 50 nm to 150 nm.

The first treatment phase of the process according to the invention advantageously includes doping the stack and, in particular, doping the $Si_{1-x}Ge_x$ layer, for example with boron or phosphorus atoms. This doping may be carried out by implantation after the various layers of the stack have been formed.

As a variant, the doping of the stack may be carried out in situ. In this case, the doping of the stack advantageously includes introducing a dopant into the gas mixture used for depositing the first continuous layer formed from $Si_{1-x}Ge_x$, after an undoped $Si_{1-x}Ge_x$ sublayer has been deposited.

More specifically, a gaseous compound of the desired dopant, for example $B_2H_6$ or $PH_3$, may be added to the gas mixture used for the deposition. The proportion of gaseous compound of the dopant in the gas mixture will depend on the desired content of the dopant in the layer deposited. In general, the doping levels are equal to or greater than $10^{17}$ $cm^{-3}$ and preferably about $10^{20}$ $cm^{-3}$.

The predeposition of an undoped $Si_{1-x}Ge_x$ layer before depositing the doped $Si_{1-x}Ge_x$ layer is recommended in order to prevent the dopant from diffusing through the thin gate oxide layer formed from $SiO_2$. This predeposition, to a thickness sufficient to protect this gate oxide, is carried out as described above with regard to deposition of the $Si_{1-x}Ge_x$ layer.

In the phase of forming the gate of the transistor, the first etching step is advantageously carried out by means of a high-density plasma of a gas mixture consisting of $Cl_2$ and of either $N_2$ or $NH_3$ or of an $N_2/NH_3$ mixture.

The second etching step includes a main etching step advantageously stopped before the gate oxide is reached, and preferably stopped 30 to 40 nm before the gate oxide is reached.

The second etching step preferably includes, after the main etching step, a step of overetching by means of a high-density gas plasma of a gas mixture consisting of $Cl_2$ and of $N_2$ or $NH_3$, or of a mixture of the latter, and optionally of $O_2$.

Still within the phase of forming the gate of the transistor, the encapsulation layer is advantageously deposited on the gate region surmounted, at least partly, by the inorganic mask, it being possible for this encapsulation layer also to be deposited on the gate region completely free of the inorganic mask, where possible.

This inorganic mask is, for example, formed from an $SiO_2$ layer, optionally surmounted by an SiON layer.

The $SiO_2$ or SiON layer forming the encapsulation layer is advantageously deposited by a CVD-type gas plasma. The thickness of this encapsulation layer is advantageously between 5 and 10 nm.

The second treatment phase of the process according to the invention is advantageously provided for forming the isolating side regions using a low-temperature gas plasma ($SiO_2$ deposition) or using $Si_3N_4$.

Other advantages and characteristics of the invention will emerge upon examining the detailed description of an entirely non-limiting method of implementation and from the appended drawings in which:

FIGS. 1 to 8 illustrate very diagrammatically the main steps in one method of implementing the process according to the invention.

In FIG. 1, the reference SB denotes in a general way a semiconductor substrate, for example a silicon substrate, in which an active region ZA has been made for the implantation of the future transistor, which active region is isolated to the sides in this example by isolating oxide regions B1 and B2 made in shallow trenches (BOX process). Of course, other methods of side isolation are possible, especially side-isolation regions of the LOCOS type, well known to those skilled in the art.

The active region ZA has a bare silicon surface or a silicon surface covered with a protective chemical oxide.

Next, a layer 1 of silicon oxide $SiO_2$ serving as the gate oxide layer, and typically having a thickness $\leq 5$ nm, is produced.

More specifically, this gate oxide layer may be produced in a conventional dry or wet oxidation reactor before the wafer is introduced into the single-wafer reactor for the purpose of depositing, in particular, the $Si_{1-x}Ge_x$ layer.

In the other figures, and for the purpose of simplification, from now on only the active region ZA of the substrate will be illustrated.

The first step in the process of the invention (FIG. 2) consists in depositing, on the silicon oxide layer 1, in the single-wafer reactor, a silicon primer layer 2 with a thickness $\leq 1$ nm, preferably about 0.5 nm, using a gas mixture at a temperature of less than 580° C. With regard to the gas mixtures which can be used for the CVD deposition, a mixture of silane and hydrogen ($SiH_4/H_2$) is used here. The gas flow rates used are preferably 400 $cm^3$ per minute for 30 seconds under standard conditions in the case of the silane and preferably 20 to 30 liters per minute under standard conditions in the case of the hydrogen.

The deposition temperature of the primer layer is between 500 and 580° C., preferably 550° C.

The deposition pressure is generally atmospheric pressure.

One important characteristic of this step of depositing the silicon primer layer is that the thickness of the final primer layer is $\leq 2$ nm, preferably about 0.5 nm. Consequently, the duration of this deposition step must be determined depending on the other deposition conditions in order to ensure that the thickness of the primer layer is less than or equal to 2 nm.

Producing such a primer layer with a thickness of less than or equal to 2 nm makes it possible to deposit a polycrystalline $Si_{1-x}Ge_x$ layer having a minimum grain size of about 20 nm in the most unfavourable case of a 100 nm layer of pure Ge, without affecting the electrical properties (shift in the threshold voltage $V_t$).

The second step in the process according to the invention is the deposition of a layer 3 of $Si_{1-x}Ge_x$ where $0<x\leq 1$. Preferably, x is between 0.05 and 1, or preferably between 0.25 and 1 and even better between 0.50 and 1. The gas mixture generally used for the CVD deposition is a mixture of silane, germane and hydrogen ($SiH_4/GeH_4/H_2$).

The proportions of the various gases in the mixture vary depending on the desired germanium and silicon contents of the $Si_{1-x}Ge_x$ layer and may be easily determined by those skilled in the art depending on the desired composition of the $Si_{1-x}Ge_x$ layer.

The deposition is carried out at a temperature of between 400 and 550° C., and preferably between 450 and 550° C. The higher the germanium content of the gas mixture, the lower the deposition temperature must be. Thus, in order to deposit a layer of pure germanium, the deposition temperature will be between 400 and 450° C.

The total deposition pressure is generally atmospheric pressure.

The deposition time depends on the temperature and pressure conditions, on the proportions of the various gases in the gas mixture and on the desired thickness of the polycrystalline $Si_{1-x}Ge_x$ layer. In general, the thickness of the polycrystalline $Si_{1-x}Ge_x$ layer will be between 50 nm and 200 nm, preferably between 100 and 150 nm and even better between 80 and 150 nm.

Next, a second silicon layer 4 (or encapsulation layer) is deposited on the silicon-germanium layer 3 using a gas mixture, for example a mixture of silane and hydrogen. This layer generally has a thickness of 50 to 200 nm, and preferably 50 to 100 nm.

Thus, by way of example, an $Si_{1-x}Ge_x$ layer, where x=0.55, has been deposited, in a single-wafer reactor, on a silicon oxide layer of a wafer in the case of CMOS technology with a channel $\leq 0.18$ μm, under the conditions indicated below:

a. Deposition of a silicon primer layer.
   Stabilization of the temperature at 550° C.
   Deposition by means of an $SiH_4/H_2$ gas mixture of a silicon layer with a thickness of less than 0.5 nm (measured by growth kinetics and estimated by ellipsometry):
   $SiH_4$: 400 scm$^3$/min
   $H_2$: 20 sl/min
   Temperature: 550° C.
   Pressure: atmospheric pressure
   Deposition time: 30 seconds.

b. Deposition of a polycrystalline $Si_{1-x}Ge_x$ layer, x=0.55, with a thickness of 60 nm.
   Stabilization of the temperature at 450° C.
   Deposition of the $Si_{1-x}Ge_x$ layer by means of an $SiH_4/GeH_4/H_2$ gas plasma:
   $SiH_4$: 70 scm$^3$/min
   $GeH_4$ (10% in $H_2$): 300 scm$^3$/min
   $H_2$: 30 sl/min
   Temperature: 450° C.
   Pressure: atmospheric pressure
   Deposition time: 70 seconds.

c. Deposition of a silicon encapsulation layer with a thickness of 140 nm.
   Stabilization of the temperature at 600° C.
   Deposition of the silicon layer by means of a gas plasma:
   $SiH_4$: 300 scm$^3$/min
   $H_2$: 30 sl/min
   Temperature: 600° C.
   Pressure: atmospheric pressure
   Deposition time: 270 seconds.

A layer of $Si_{1-x}Ge_x$ where x=1 (pure Ge) was also deposited by way of example, in a single-wafer reactor, on a silicon oxide layer of a wafer in the case of CMOS technology with a channel $\leq 0.18$ μm, under the conditions indicated below:

a. Deposition of a silicon primer layer.
   Stabilization of the temperature at 550° C.
   Deposition by means of an $SiH_4/H_2$ gas mixture of a silicon layer with a thickness of less than 0.5 nm (measured by growth kinetics and estimated by ellipsometry):
   $SiH_4$: 400 scm$^3$/min
   $H_2$: 20 sl/min
   Temperature: 550° C.
   Pressure: atmospheric pressure
   Deposition time: 30 seconds.

b. Deposition of a polycrystalline $Si_{1-x}Ge_x$ layer, x=1, with a thickness of 60 nm.
   Stabilization of the temperature at 450° C.
   Deposition of the Ge layer by means of a $GeH_4/H_2$ gas plasma:
   $GeH_4$ (10% in $H_2$):300 scm$^3$/min
   $H_2$: 30 sl/min
   Temperature: 450° C.
   Pressure: atmospheric pressure
   Deposition time: 45 seconds.

c. Deposition of a silicon encapsulation layer with a thickness of 140 nm.
   Stabilization of the temperature at 600° C.
   Deposition of the silicon layer by means of a gas plasma:
   $SiH_4$: 300 scm$^3$/min
   $H_2$: 30 sl/min
   Temperature: 600° C.
   Pressure: atmospheric pressure
   Deposition time: 270 seconds.

The first treatment phase, including the formation of the Si, Si/Ge and Si stack, in a single-wafer furnace makes it possible to control the nucleation of the SiGe on the gate oxide perfectly, to check the thickness uniformity and germanium concentration uniformity on the wafer and to form a polycrystalline SiGe/Si two-layer system without exposing the wafer to air between the two layers.

These advantages are not found in a multi-wafer furnace, especially because of the very long deposition times, giving rise to growth of the germanium, the grains of which will also coarsen with at least two negative effects, which are an increase in the roughness and the possibility of deposited layers being non-continuous and non-uniform. Furthermore, in a multi-wafer furnace, it is difficult to obtain deposited layer which are uniform in terms of composition because of the depletion effect (especially in germanium concentrations of greater than 50%).

Single-wafer deposition makes it possible to control germanium concentrations of from 0 to 100% and especially allows particularly useful layers to be deposited in which the concentration is greater than 50%.

Furthermore, the formation of a two-layer system in which the silicon-germanium layer is surmounted (encapsulated) by a silicon layer, makes it possible to approach, in the rest of the technological steps, conventional integration processes, i.e. "all silicon" processes.

This is because, in the case of germanium concentrations of less than 100%, the gate must be CMOS compatible, i.e. it must be locally n- or p-implanted, depending on the type of transistor to be produced. These local implantations are carried out through an organic resin mask which involves subsequently removing this resin. It is precisely the removal of this resin and the suitable surface cleaning which require the silicon-germanium gate to be encapsulated under a silicon layer so as not to modify, or even remove, the silicon-germanium layer during resin removal.

The thicknesses of the silicon-germanium layer (or the germanium layer) and of the encapsulation silicon layer result from a compromise between the growth of the germanium or silicon/germanium grains (so as to avoid heterogeneous nucleation) and the growth of the polycrystalline encapsulation silicon which bears on these grains. Moreover, in the case of electrical stresses, the silicon-germanium layer must be as continuous as possible, i.e. must have the lowest possible roughness. This silicon-germanium layer must therefore be thick enough, but not too thick. The total thickness of the gate thus formed is, for example, 200 nm in the case of 0.18 $\mu$m technology. It will be smaller in the case of technologies below 0.18 $\mu$m, typically about 100 to 150 nm. The current compromise is an SiGe layer with a thickness of 120 nm and a silicon encapsulation layer with a thickness of 80 nm, in the case of 0.18 $\mu$m technology.

Figure 2:
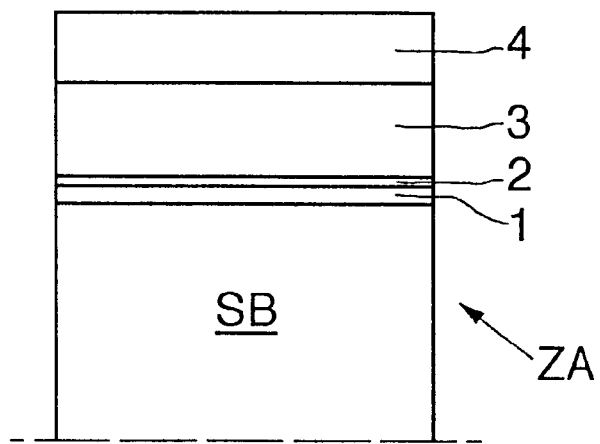
Figure 3:
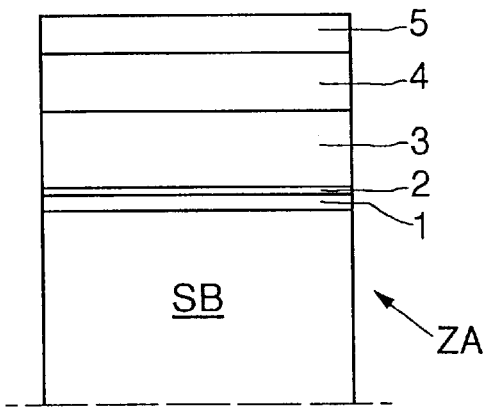
Figure 4:
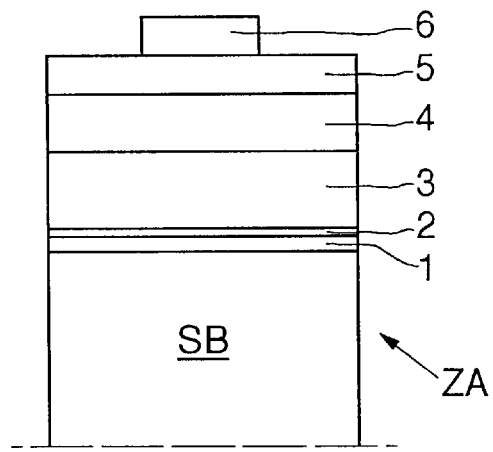
Figure 5:
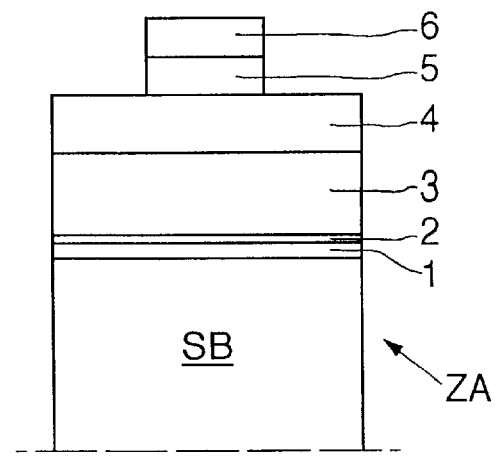
Figure 6:
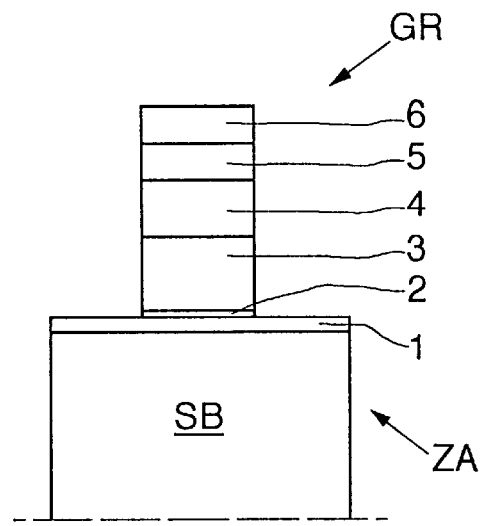

The next step in the process according to the invention consists in doping the stack formed in the FIG. 2. It should be noted here that, for a gate made of pure germanium or having a germanium concentration greater than 75%, the gate will be p-type-doped whatever the transistor type, this being so for theoretical reasons. In general, the doping of the gate is carried out either by full-wafer ion implantation, i.e. in-situ implantation during the actual deposition of the stack in the single-wafer reactor using gas mixtures.

A polycrystalline $Si_{1-x}Ge_x$ layer, doped for example with boron or phosphorous, may thus be deposited directly, by adding a gaseous compound of the desired dopant, for example $B_2H_6$ or $PH_3$, to the gas mixture used for the deposition. The proportion of gaseous compound of the dopant in the gas mixture will depend on the desired dopant content in the layer deposited. Generally, the doping levels are equal to or greater than $10^{17}$ cm$^{-3}$ and preferably about $10^{20}$ cm$^{-3}$.

In the case of direct deposition of a doped $Si_{1-x}Ge_x$ layer, it is recommended, in order to avoid diffusion of the dopants in the thin layer of $SiO_2$ (gate oxide), to predeposit an undoped $Si_{1-x}Ge_x$ layer before depositing the doped $Si_{1-x}Ge_x$ layer. This predeposition, to a thickness sufficient to protect the subjacent gate oxide, is carried out as described previously in the case of the deposition of the $Si_{1-x}Ge_x$ layer. Once the predeposition has been carried out, the gaseous compound of the dopant is added to the gas mixture in order to deposit the doped $Si_{1-x}Ge_x$ layer, as indicated above.

The silicon encapsulation layer 4, which may also be doped, is preferably deposited in the single-wafer reactor using a conventional gas mixture, for example a mixture of silane and hydrogen, which optionally contains a gaseous compound of the dopant, such as $B_2H_6$ and $PH_3$, under conventional conditions.

In conventional silicon technology, the gate is etched after a step of photolithography of a conventional organic resin.

Unfortunately, high-density plasma etching processes conventionally used for etching silicon are not suitable for etching an $Si_{1-x}Ge_x$ layer or an $Si_{1-x}Ge_x$/Si stack, in particular when the germanium content of the poly $Si_{1-x}Ge_x$ layer is greater than 50% (x>0.5). This is because the conventional plasma etching processes deform the profiles of the etched features, in particular the side walls of the latter.

The etching according to the invention starts by the formation (FIG. 3) of a mask 5 made of inorganic material, and comprises the deposition, using a conventional process such as low-pressure chemical vapour deposition, of an inorganic material, for example an $SiO_2$ layer or an $SiO_2$/SiON double layer.

After a conventional resin mask 6 has been formed (FIG. 4) on this layer 5 of inorganic material, for example by photolithography, the mask 5 of inorganic material is etched (FIG. 5), preferably by high-density plasma etching, and more preferably by using a gas mixture of chlorine and of nitrogen and/or ammonia.

An essential characteristic of the etching of the gate GR according to the invention (FIG. 6) consists of a main, aniosotropic, etching step using a chlorine-based high-density gas plasma which contains no oxygen or HBr and which includes $N_2$ or $NH_3$ or a mixture thereof in order to form a passivation layer on the etching side walls by co-adsorption with atomic chlorine so as to reduce the chlorine-induced spontaneous lateral etch rate. This addition of $N_2$ or $NH_3$, or of a mixture of these compounds, leaves no or few etching residues, and does not cause lateral erosion or impairment of the $Si_{1-x}Ge_x$ layer or of the subjacent gate oxide. Furthermore, the use of such a gas mixture is compatible with industrial methods of implementing the etching process.

The proportions of $N_2$ and/or $NH_3$ introduced into the gas mixture of the plasma may be determined experimentally, in a conventional manner, and must be sufficient to block the kinetics of the spontaneous chemical reactions responsible for the lateral etching of the side walls of the etched features not exposed to the ion bombardment, without correspondingly blocking the kinetics of the reactions induced by the ion bombardment responsible for the vertical etching.

Preferably, in the process of the present invention, the main etching step is followed by an overetching step in which the energy of the ions in the plasma is lower than the main etching step. During this overetching step, it is possible to use the same gas mixture as in the main etching step, but it is also possible to use gas mixtures containing oxygen, since the passivation layer formed on the side walls of the feature etched during the main etching step using the gas mixture containing no oxygen or HBr protects the side walls of the etched feature from being spontaneously etched by the oxygen atoms during this overetching step.

The amount of oxygen may be determined experimentally in order to increase the $Si_{1-x}Ge_x$/gate oxide selectivity without causing spontaneous lateral etching of the etched features.

Also preferably, the main etching step is stopped before the subjacent layer 1 of silicon oxide is reached, preferably at a distance of between 30 and 40 nm from the silicon oxide 1. Thus, any risk of damaging the gate oxide during the main etching step is avoided.

The abovementioned example, in which a stack of a polycrystalline $Si_{0.45}Ge_{0.55}$ first layer 3 (120 nm thick) and of a polycrystalline silicon second layer 4 (80 nm thick) is formed on a silicon oxide layer 1 of a substrate and on a primer layer 2, is repeated. A masking layer 5 made of an inorganic material, for example a silicon oxide layer, is deposited on the polycrystalline silicon second layer 4.

After a resin mask 6 has been formed on the masking layer of inorganic material, the masking layer and the stack are etched under the conditions indicated in Table I below.

TABLE I

|  | Gas mixture | Plasma | | Treatment time (s) |
|---|---|---|---|---|
|  |  | Power of the source (W) | Bias power applied to the substrate holder (W) |  |
| Puncture of the mask of inorganic material | HBr/Cl$_2$/O$_2$ (40/40/8)* | 2500 | 400 | 5 |
| Main etching step | RBr/Cl$_2$/O$_2$ (40/40/8) | 2500 | 150 | 52 |

*In the examples, except where otherwise indicated, all the gas flow rates are expressed in cm$^3$/minute under standard conditions.

A significant deformation of the etching profile of the features in the side walls of the polycrystalline Si$_{0.45}$Ge$_{0.55}$ layer is observed. Analysis by X-ray photoelectron spectroscopy of the thickness of the oxide layer which passivates the side walls of the etched features shows that this layer has a thickness of 1 nm on the side walls of the polycrystalline Si$_{0.45}$Ge$_{0.55}$ layer as compared with 3 nm on the side walls of the polycrystalline silicon layer.

As in the case of polycrystalline silicon, the passivation layer on the Si$_{0.45}$Ge$_{0.55}$ side walls is a highly chlorinated substoichiometric silicon oxide. The passivation layer is therefore formed only from silicon-etching reaction products, which explains why its thickness on the side wall of the etched feature decreased in the case of the Si$_{0.45}$Ge$_{0.55}$ layer.

After this phase of etching the gate GR (FIG. 6), the etching residues and optionally, where possible, the hard mask 5 are removed. This step consists in a deoxidation step in a low-concentration (≦1%) HF bath. Typically, this step corresponds to etching 10 Å of thermal oxide over the full wafer. It serves mainly to dissolve all the polymer residues which may have been generated during the etching of the gate.

In the case of a hard mask composed of a silicon oxide layer surmounted by an SiON layer, the SiON layer was consumed during the actual gate-etching step. In this case the configuration is the same as in the case of a hard mark composed solely of SiO$_2$.

In this step, it is possible, but not essential, also to remove the entire hard mask 5 if the removal time is compatible with the technology employed. This is in particular the case with a 60 nm hard mask of SiO$_2$ in 0.18 μm technology. This is because the time to remove the hard mask in a dilute hydrofluoric acid bath is typically equal to the time to etch a 60 Å thermal oxide.

Figure 7:
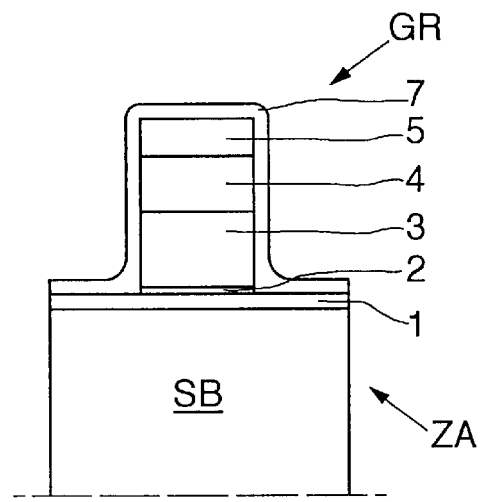

However, in the rest of the text it will be assumed, as illustrated in particular in FIG. 7, that the hard mask 5 has not been completely removed. The next step (FIG. 7) consists in encapsulating the gate GR in a material 7 which is non-oxidizing with respect to germanium, typically a layer of silicon oxide SiO$_2$ or SiON. This step of encapsulating the gate is essential for protecting the side walls of the gate during the following technological steps which consist, in particular, in carrying out the implantations of the drain and source regions, requiring photolithography steps which, because of the need to remove an organic resin, would damage the silicon/germanium layer.

This silicon oxide encapsulation layer is formed by CVD-type deposition using a gas plasma. The choice of a plasma oxide for this encapsulation is justified by the fact that germanium reacts very strongly with oxygen. It is therefore necessary to use a process in which atomic oxygen has a very short lifetime in the gas phase, as is the case for an oxide formed by low-temperature plasma-enhanced chemical vapour deposition (PECVD).

The typical thickness of this encapsulation layer 7 is between 5 and 10 nm. This small thickness is justified in order not to be too far away from conventional silicon technologies which use a thermal oxide with a thickness which varies between 2.5 and 5 nm. Moreover, this small thickness allows the depth of the various implantations to be controlled without impairing the intrinsic electrical properties of the transistors.

Figure 8:
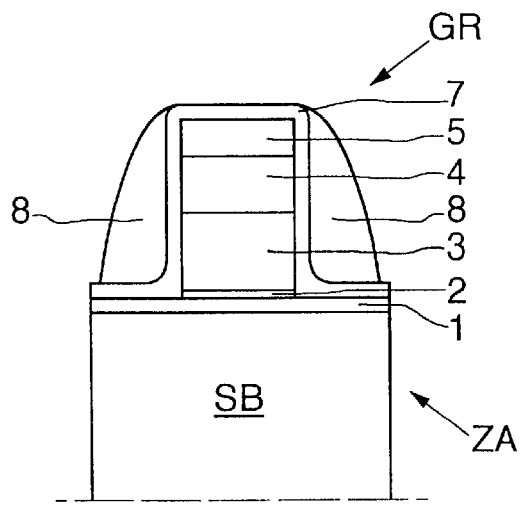

This transistor, including the encapsulated gate GR, may then be subjected to conventional steps (not illustrated for the purpose of simplification) of photolithography and of implantation of the source and drain regions (for example, LDD implantations) in order to form the side gate-isolating regions (spacers 8, FIG. 8). The choice of material depends on the possible thermal balance of the technologies employed. This means that, because of the fact that the encapsulation oxide 7 protecting the side walls of the gate GR is porous to oxygen, any deposition involving oxygen at high temperature has to be excluded, such as, in particular, temperature-enhanced silicon oxidation (TEOS deposition). On the other hand, the material for the spacers may be either a plasma oxide (SiO$_2$) obtained at low temperature or a silicon nitride Si$_3$N$_4$. The typical thicknesses of the deposited layers are optimized depending on the constraints of the technologies employed. Typically, it is possible to deposit a 250 nm thick SiO$_2$ layer or a 100 nm thick Si$_3$N$_4$ layer for spacers which, after etching, will have a width at the base of the gate of 0.1 to 0.13 μm.

The etching of spacers is a conventional step well known to those skilled in the art. It should be noted here that, if it was not possible to remove the hard mask 5 during the step of removing the polymer residues after etching the gate, it can now be removed either during the step of dry-etching the spacers, or by chemical etching which is selective with respect to the spacers at the end of this step.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. Process for obtaining an Si$_{1-x}$Ge$_x$ isolated-gate field-effect transistor, where 0<x≦1, from a semiconductor substrate, the semiconductor substrate comprising an active region surmounted by a gate oxide layer, this process comprising:

a first phase of treatment inside a single-wafer reactor, comprising depositing, on the gate oxide layer, a silicon primer layer with a thickness of less than or equal to 1 nm using chemical vapour deposition at a temperature of less than or equal to 580° C. and depositing, on the primer layer, a stack comprises a first continuous layer formed from Si$_{1-x}$Ge$_x$, obtained by chemical vapour deposition at a temperature of less than or equal to 550° C., surmounted by a second silicon layer, then a phase of forming a gate region of the transistor, comprising depositing, on the said stack, a top layer comprising an inorganic material, etching firstly the said top layer so as to obtain an inorganic mask surmounting the said stack, etching secondly the said stack using the said mask, so as to form the gate region, and depositing, on the gate region, an encapsulation layer formed from a material which is non-oxidizing with respect to germanium, and then a second treatment phase comprising forming, on the side walls of the encapsulated gate, isolating side regions formed from a material which is non-oxidizing with respect to germanium.

2. Process according to claim 1, wherein the primer layer is deposited at a temperature of between 500 and 580° C. and the first continuous layer formed from $Si_{1-x}Ge_x$ is deposited at a temperature of between 400 and 500° C.

3. Process according to claim 1, wherein the primer layer has a thickness of approximately 0.5 nm.

4. Process according to claim 1, wherein the gas mixture for depositing the primer layer is formed by a mixture of silane and hydrogen, and the gas mixture for depositing the first continuous layer formed from $Si_{1-x}Ge_x$ is formed by a mixture of silane, germane and hydrogen.

5. Process according to claim 1, wherein the first treatment phase further comprises doping the stack.

6. Process according to claim 5, wherein doping of the stack comprises introducing a dopant into the gas mixture used for depositing the first continuous layer formed from $Si_{1-x}Ge_x$ after an undoped $Si_{1-x}Ge_x$ sublayer has been deposited.

7. Process according to claim 1, wherein the first etching step is carried out by means of a high-density plasma of a gas mixture consisting of $Cl_2$, $N_2$ and/or $NH_3$.

8. Process according to claim 1, wherein the second etching step comprises an anisotropic main etching step carried out by means of a high-density plasma of a gas mixture consising of $Cl_2$ and of either $N_2$ or $NH_3$, or of a mixture of $N_2$ and $NH_3$.

9. Process according to claim 8, wherein the second etching step is stopped before the gate oxide is reached, preferably from 30 to 40 nm before the gate oxide is reached.

10. Process according to claim 8, wherein the second etching step further comprises overetching by means of a high-density gas plasma of a gas mixture consisting of $Cl_2$ and of $N_2$ or $NH_3$ or of a mixture of the latter, and optionally of $O_2$.

11. Process according to claim 1, wherein the encapsulation layer is deposited on the gate region at least partly surmounted by the inorganic mask.

12. Process according to claim 1, wherein the organic mask is formed from an $SiO_2$ layer, optionally surmounted by an SiON layer.

13. Process according to claim 1, wherein the encapsulation layer is an $SiO_2$ or SiON layer deposited by CVD-type gas plasma.

14. Process according to claim 13, wherein the thickness of the encapsulation layer is between 5 and 10 nm.

15. Process according to claim 1, wherein the side isolating regions are formed from $SiO_2$ deposited by low-temperature gas plasma, or from $Si_3N_4$.

16. Process according to claim 1, wherein the gate oxide layer is deposited ill the single-wafer reactor.

17. Process according to claim 1, wherein x is between 0.5 and 1.0.

18. Process according to claim 1, wherein the thickness of the first continuous layer of $Si_{1-x}Ge_x$ is between 50 and 200 nm and the thickness of the second silicon layer is between 50 and 200 nm.

19. A process for forming a $Si_{1-x}Ge_x$ isolated-gate field-effect transistor, where $0<x\leq1$, upon a semiconductor substrate which comprises an active region surmounted by a gate oxide layer, comprising:

depositing a silicon primer layer on the gate oxide layer;

depositing a stack comprising a first continuous layer formed from $Si_{1-x}Ge_x$, where $0<x\leq1$, surmounted by a second silicon layer upon the silicon primer layer;

forming a mask upon the stack;

etching the stack such that the gate region is formed below the mask;

depositing an encapsulation layer upon the stack, wherein the encapsulation layer is formed from a material which is non-oxidizing with respect to germanium; and forming isolating side regions on side walls of the gate, wherein the isolating side regions are formed from a material which is non-oxidizing with respect to germanium.

20. The process of claim 19, wherein etching the stack comprises using a high-density plasma of a gas mixture comprising chlorine ($Cl_2$) and ammonia ($NH_3$).

* * * * *

UNITED STATES PATENT AND TRADEMARK OFFICE
CERTIFICATE OF CORRECTION

PATENT NO. : 5,998,289
DATED : December 7, 1999
INVENTOR(S) : Isabella Sagnes

It is certified that error appears in the above-identified patent and that said Letters Patent is hereby corrected as shown below:

Claim 16, col. 12, line 17, please delete "ill" and substitute therefor -- in --.

Signed and Sealed this

Fourteenth Day of November, 2000

Attest:

Q. TODD DICKINSON

*Attesting Officer*   *Director of Patents and Trademarks*